United States Patent
Zheng et al.

(10) Patent No.: US 9,691,810 B1
(45) Date of Patent: Jun. 27, 2017

(54) CURVED IMAGE SENSOR

(71) Applicant: OMNIVISION TECHNOLOGIES, INC., Santa Clara, CA (US)

(72) Inventors: Yuanwei Zheng, San Jose, CA (US); Gang Chen, San Jose, CA (US); Duli Mao, Sunnyvale, CA (US); Dyson Tai, San Jose, CA (US); Arvind Kumar, Manchester, MA (US); Hung Chih Chang, Newark, CA (US); Chih-Wei Hsiung, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/974,362

(22) Filed: Dec. 18, 2015

(51) Int. Cl.
*H01L 27/146* (2006.01)

(52) U.S. Cl.
CPC .... *H01L 27/14685* (2013.01); *H01L 27/1463* (2013.01); *H01L 27/14621* (2013.01); *H01L 27/14627* (2013.01); *H01L 27/14645* (2013.01)

(58) Field of Classification Search
CPC ......... H01L 27/14627; H01L 27/14609; H01L 27/14643; H01L 27/14685; H01L 27/14621; H01L 27/1463; H01L 27/14645; H01L 27/14687; H01L 27/14683; H01L 27/146; H01L 27/14689; H01L 27/14601; H01L 27/14662; H01L 27/14625; H01L 27/14634; H01L 27/14603; H01L 27/14636
See application file for complete search history.

(56) References Cited

U.S. PATENT DOCUMENTS

| | | | | |
|---|---|---|---|---|
| 7,968,923 | B2 * | 6/2011 | Nagaraja | H01L 27/14621 257/292 |
| 8,232,132 | B2 * | 7/2012 | Nagaraja | H01L 27/14621 257/E31.121 |
| 8,450,821 | B2 * | 5/2013 | Lake | G02B 3/0056 257/432 |
| 8,772,069 | B2 * | 7/2014 | Lake | G02B 3/0056 257/432 |
| 2008/0136956 | A1 * | 6/2008 | Morris | H01L 27/14618 348/340 |
| 2010/0038523 | A1 * | 2/2010 | Venezia | H01L 27/14627 250/216 |
| 2010/0244165 | A1 * | 9/2010 | Lake | G02B 3/0056 257/432 |
| 2010/0327389 | A1 * | 12/2010 | McCarten | H01L 27/14603 257/447 |
| 2010/0330728 | A1 * | 12/2010 | McCarten | H01L 27/1464 438/70 |

(Continued)

*Primary Examiner* — John Lee
(74) *Attorney, Agent, or Firm* — Blakely Sokoloff Taylor & Zafman LLP

(57) ABSTRACT

An image sensor includes a plurality of photodiodes arranged in an array and disposed in a semiconductor material with pinning wells disposed between individual photodiodes in the plurality of photodiodes. The image sensor also includes a microlens layer. The microlens layer is disposed proximate to the semiconductor material and is optically aligned with the plurality of photodiodes. A spacer layer disposed between the semiconductor material and the microlens layer. The spacer layer has a concave cross-sectional profile across the array, and the microlens layer is conformal with the concave cross-sectional profile of the spacer layer.

20 Claims, 5 Drawing Sheets

(56) References Cited

U.S. PATENT DOCUMENTS

| | | |
|---|---|---|
| 2011/0057277 A1 | 3/2011 | Yu |
| 2011/0217807 A1* | 9/2011 | Nagaraja ............ H01L 27/14621 |
| | | 438/70 |
| 2012/0080765 A1* | 4/2012 | Ku ..................... H01L 27/14698 |
| | | 257/432 |
| 2013/0237002 A1* | 9/2013 | Lake .................... G02B 3/0056 |
| | | 438/65 |
| 2013/0256822 A1* | 10/2013 | Chen ................. H01L 27/14632 |
| | | 257/443 |
| 2015/0014802 A1* | 1/2015 | Cheng ................. H01L 27/1462 |
| | | 257/432 |
| 2015/0372033 A1* | 12/2015 | Cheng ................. H01L 27/1462 |
| | | 257/432 |
| 2016/0126272 A1* | 5/2016 | Kim .................. H01L 27/14607 |
| | | 250/208.1 |
| 2016/0172393 A1* | 6/2016 | Kim .................. H01L 27/14603 |
| | | 348/308 |
| 2016/0307940 A1* | 10/2016 | Cheng ............... H01L 27/14629 |
| 2016/0307942 A1* | 10/2016 | Cheng ................ H01L 27/1464 |
| 2016/0307943 A1* | 10/2016 | Cheng ................ H01L 27/1464 |

\* cited by examiner

US 9,691,810 B1

CURVED IMAGE SENSOR

TECHNICAL FIELD

This disclosure relates generally to image sensor fabrication, and in particular but not exclusively, relates to curved image sensors.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices. While advances in pixel design have dramatically improved image sensor performance, several optical limitations have proved difficult to overcome by optimizing pixel circuitry alone.

Chemical mechanical polishing (CMP) is integral to semiconductor device fabrication. It can be used to thin wafers, remove excess deposition flux, and planarize surfaces. Further, the polish rate is selective to the composition of the films on the surface. Since CMP may be less precise than other fabrication techniques and is generally rougher on the semiconductor wafers, CMP may induce defects into electronic devices if not properly controlled. Defects may include pitting of the wafer, scratches on the wafer surface, and the destruction of layers of device architecture. Accordingly, optimizing the CMP process is desirable in electrical device fabrication.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
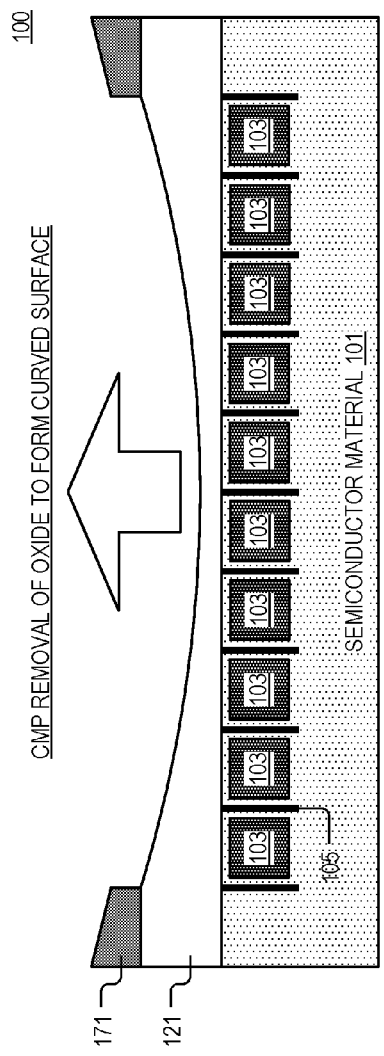
FIG. 1A illustrates of one example of a partially completed curved image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a curved image sensor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A shows one example of a cross section of partially completed curved image sensor 100. Partially completed curved image sensor 100 includes: semiconductor material 101, plurality of photodiodes 103, pinning wells 105, spacer layer 121, and dye-edge structures 171. Plurality of photodiodes 103 are arranged in an array and disposed in semiconductor material 101 and pinning wells 105 are disposed between individual photodiodes 103. Spacer layer 121 is disposed between semiconductor material 101 and dye-edge structures 171. In one example, spacer layer 121 is an oxide such as silicon oxide or the like, and dye-edge structures 171 are a nitride such as silicon nitride or the like, and are disposed on spacer layer 121 on opposite ends of the array of photodiodes 103 as shown. In the depicted example, partially completed curved image sensor 100 has just undergone a CMP process. Since, in the depicted example, dye-edge structures 171 are harder (or more resistant to the CMP process) than spacer layer 121, spacer layer 121 was removed faster than dye-edge structures 171. As a result, spacer layer 121 was dished (thinner towards the middle of the array of photodiodes 103, and thicker towards the sides of the array of photodiodes 103). In one or more examples, the dye-edge structures may be thinner or rounded after CMP.

Figure 1B:
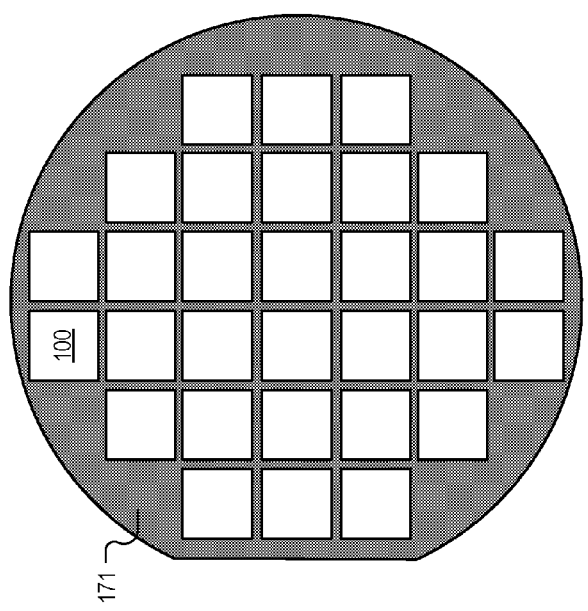
FIG. 1B illustrates a top down view of a semiconductor wafer including the partially completed curved image sensor of FIG. 1A, in accordance with the teachings of the present invention.

FIG. 1B shows an illustration of a top down view of a semiconductor wafer including the partially completed curved image sensor 100 of FIG. 1A. It is worth noting that dye-edge structures 171 are disposed along scribe lines on semiconductor material 101. In the depicted example, the surface of each area lacking dye-edge structures 171 may be dished. This results in the center of spacer layer 121 being thinner than the areas of spacer layer 121 closer to dye-edge structures 171. Although the depicted example uses chemical mechanical polishing to achieve curving/thinning of the wafer, other suitable processes such as etching may be employed to form the same or similar curved image sensor structures.

Figure 2:
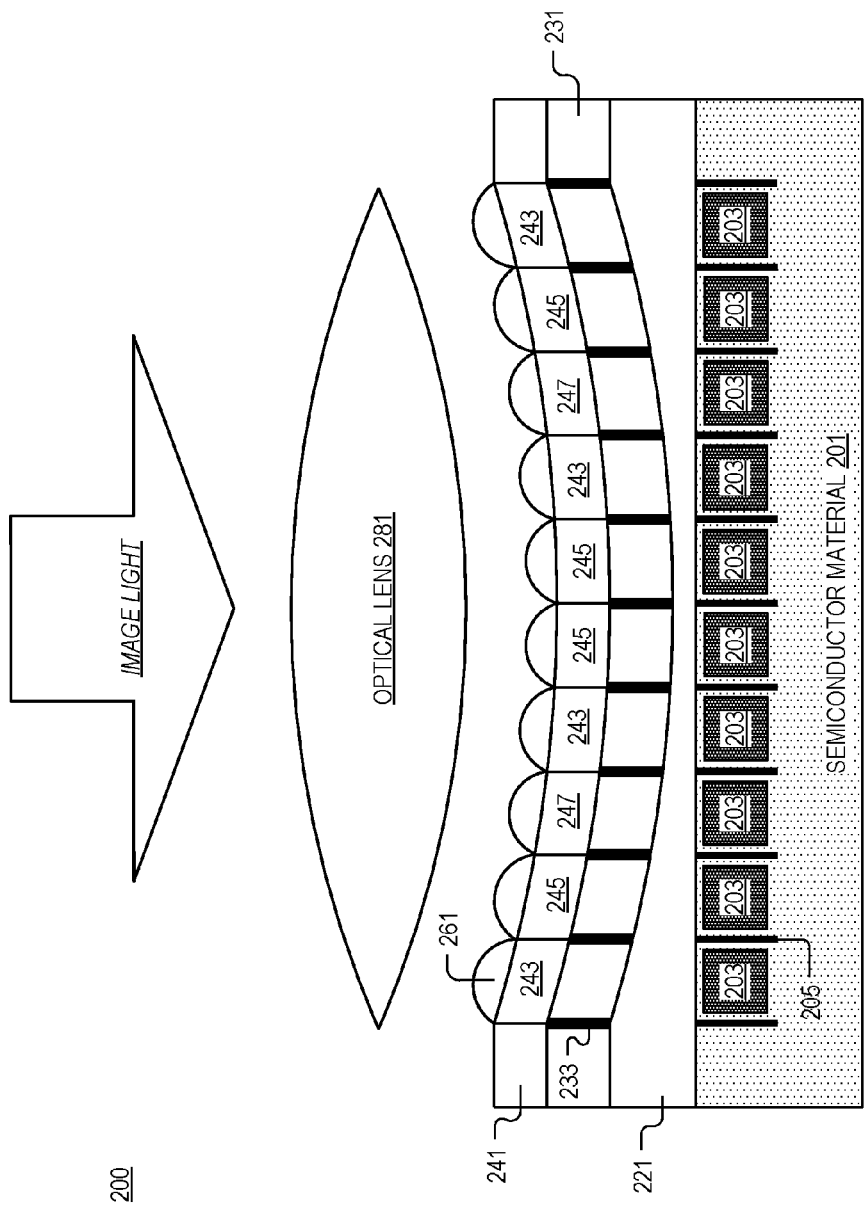
FIG. 2 illustrates of one example of a curved image sensor, in accordance with the teachings of the present invention.

FIG. 2 shows an illustration of one example of curved image sensor 200. In the depicted example, curved image sensor 200 includes: semiconductor material 201, plurality of photodiodes 203, pinning wells 205, spacer layer 221, optical grid layer 231 (with optical grid 233), color filter layer 241 (with red color filters 243, green color filters 245, and blue color filters 247), microlens layer 261, and optical lens 281. As shown in the example illustration, plurality of photodiodes 203 is disposed in semiconductor material 201 and pinning wells 205 are disposed between individual photodiodes 203 in plurality of photodiodes 203 to electrically isolate individual photodiodes 203. In one example, pinning wells 205 may include doped semiconductor material; however, in another other same example, pinning wells may include a metal/semiconductor oxide, metal/semiconductor nitride, polymer or the like. Color filter layer 241 is disposed between microlens layer 261 and semiconductor material 201. Color filter layer 241 and microlens layer 261 are optically aligned with plurality of photodiodes 203 to direct incident light into plurality of photodiodes 203. Spacer layer 221 is disposed between semiconductor material 201 and color filter layer 241, and spacer layer 221 has a concave cross-sectional profile across the array of photodiodes 203. In the depicted example, color filter layer 241 and microlens layer 261 are conformal with the concave cross-sectional profile of spacer layer 221. This may help minimize optical defects on the edge of curved image sensor 200. Optical grid layer 231 is disposed between color filter layer 241 and spacer layer 221, and optical grid layer 231 is optically aligned with plurality of photodiodes 203 such that optical grid layer 231 directs light into plurality of photodiodes 203 via an internal reflection process. In the depicted example, optical grid layer 231 is conformal with the concave cross-sectional profile of spacer layer 221. In one example, optical grid 233 may include a metal mesh. In another example, optical grid 233 may include metal, oxide, or semiconductor structure fabricated through processing techniques such as thermal evaporation, chemical vapor deposition, or the like.

In one example, plurality of photodiodes 203 is arranged into an array including rows and columns (see infra FIG. 4) and the vertex of the concave cross-sectional profile of spacer layer 221 is located at a center of the array of plurality of photodiodes 203. In the depicted example, optical lens 281 is disposed between a source of image light and semiconductor material 201, and optical lens 281 is positioned to direct image light into semiconductor material 201. To optimize device performance, in one example, a radius of curvature of the concave cross-sectional profile of spacer layer 221 approximates a radius of curvature of optical lens 281. In one example, a shutter may be disposed between image light and curved image sensor 200 to block image light from reaching curved image sensor 200 between frames or during calibration measurements.

In operation, plurality of photodiodes 203 will absorb image light to generate image charge. Image light is focused onto semiconductor material 201 (and corresponding optical structures, e.g., microlens layer 261, color filter layer 241, and optical grid layer 231) via optical lens 281. In conventional image sensors, the lens focal plane is curved but the semiconductor device stack is flat, resulting in image sensor edges that are blurred because they are out of focus (non-conforming with the curvature of the lens). Here, curved image sensor 200 may receive focused image light from optical lens 281 along the edges of curved image sensor 200 because the radius of curvature of curved image sensor 200 now approximates that of optical lens 281. Image light received along the edges of curved image sensor 200 may then be efficiently passed through microlens layer 261 and color filter layer 241 into plurality of photodiodes 203.

FIGS. 3A-3F show an example process for forming a curved image sensor (e.g., curved image sensor 200). The order in which some or all of FIGS. 3A-3F appear in process 300 should not be deemed limiting. Rather, one of ordinary skill in the art having the benefit of the present disclosure will understand that some of the process 300 may be executed in a variety of orders not illustrated, or even in parallel.

Figure 3A:
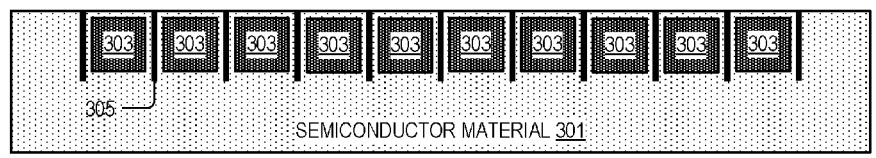
FIGS. 3A-3F illustrate an example process for forming a curved image sensor, in accordance with the teachings of the present invention.

FIG. 3A depicts an illustration of providing semiconductor material 301 including plurality of photodiodes 303 arranged in an array. In the depicted example, providing semiconductor material 301 may include forming a plurality of photodiodes 303 in a backside of semiconductor material 301. However, in a different example, plurality of photodiodes 303 may be formed in a frontside of semiconductor material 301. These two configurations may be used to form either a backside illuminated image sensor or a frontside illuminated image sensor, respectively. Additionally, in the depicted example, pinning wells 305 are disposed between individual photodiodes 303 in plurality of photodiodes 303. Pinning wells 305 may include doped semiconductor regions or may include metals, metal oxides, semiconductor oxides, and/or semiconductor nitrides. Pinning wells 305 are disposed between individual photodiodes 303 to prevent unwanted charge transfer between individual photodiodes 303 and associated circuitry (e.g., readout circuitry 411, see infra FIG. 4).

Figure 3B:
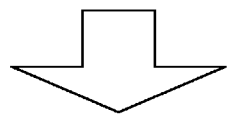
Figure 3B:
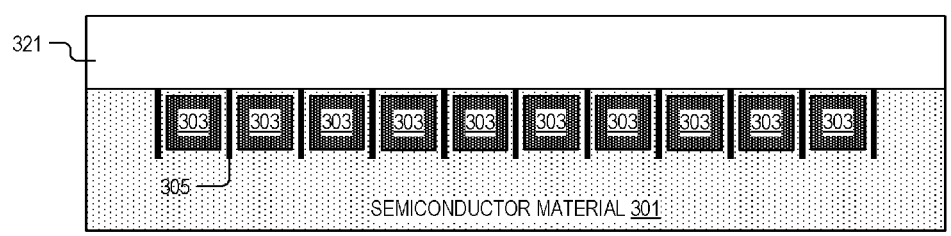

FIG. 3B depicts an illustration of depositing spacer layer 321 proximate to a surface of semiconductor material 301. In the depicted example, spacer layer 321 is disposed on semiconductor material 301. In one example, spacer layer 321 includes silicon oxide; however, in a different example, spacer layer includes other oxides, nitrides, polymers, or the like. Although not depicted, in one example, transfer gates may be formed on the surface of semiconductor material 301 prior to the deposition of spacer layer 321 and a high-k dielectric material may be disposed between the transfer gates and the surface of semiconductor material 301. Individual transfer gates may be electrically coupled to individual photodiodes 303 to transfer image charge accumulated in in photodiodes 303 to floating diffusions (not depicted) also disposed in semiconductor material 301. In one example, an isolation trench is etched in semiconductor material 301, and spacer layer 321 is deposited in the isolation trench and on the surface of semiconductor material 301.

Figure 3C:
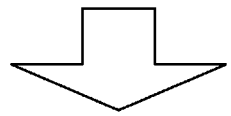
Figure 3C:
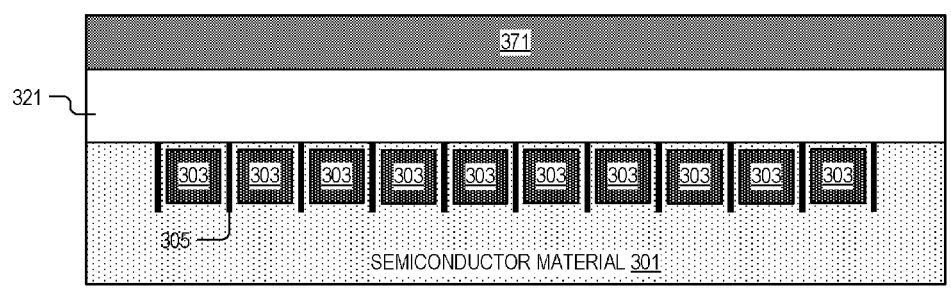

FIG. 3C depicts an illustration of depositing dye-edge layer 371 on spacer layer 321. In the depicted example, dye-edge layer 371 is conformal with spacer layer 321. Additionally, in the depicted example, dye-edge layer 371 includes silicon nitride; however, in a different example not depicted, dye-edge layer 371 may include other suitable semiconductor oxides, semiconductor nitrides, and/or metal oxides. Specifically, dye-edge layer 371, may include silicon oxynitride, aluminum oxide, hafnium oxide, etc.

Figure 3D:
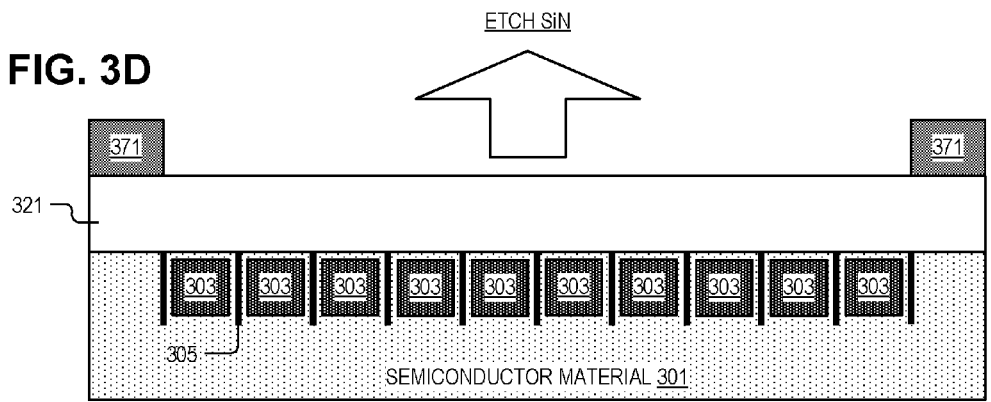

FIG. 3D depicts forming dye-edge structures 371 on a surface of spacer layer 321 proximate to opposite ends of the array of photodiodes 403 as shown. In the depicted example, dye-edge structures 371 are formed by etching the dye-edge layer 371. This etching process may include a wet and/or dry etch depending on considerations such as the desired etch rate, presence of other layer of device architecture, etc. In the depicted example, dye-edge structures 371 encircle the array including the plurality of photodiodes 303, and dye-edge structures 371 are elevated on the surface of spacer layer 321. However, in another example, dye-edge structures 371 may not encircle plurality of photodiodes 303, and may only be disposed around some edges of the array of plurality of photodiodes 303. The thickness, material composition, and location of dye-edge structures 371 may be tuned to optimize the architecture/curvature of spacer layer 321 and the associated CMP process.

In the depicted example, dye-edge structures 371 are disposed above the edges of scribe lines. While forming dye-edge structures 371, semiconductor material 301 may be still part of a larger wafer including multiple image sensors (see e.g., FIG. 1B). To form individual image sensors, semiconductor material 301 is diced into multiple semiconductor dyes along the scribe lines.

Figure 3E:
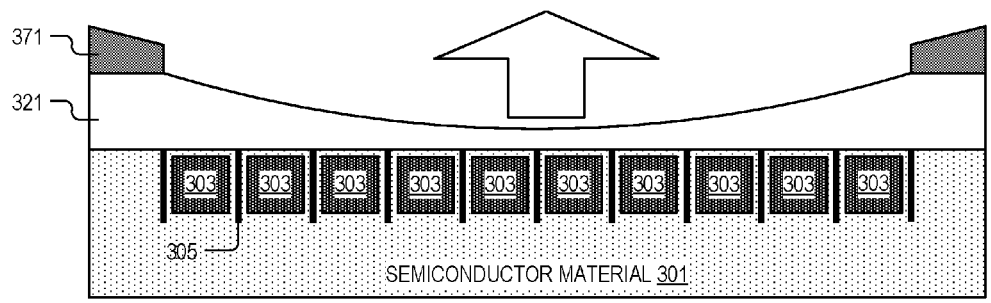

FIG. 3E shows an example illustration of polishing spacer layer 321 and dye-edge structures 371. Polishing results in a concave cross-sectional profile of spacer layer 321 across the array of photodiodes 403. Polishing may include chemical mechanical polishing (CMP) where a wafer with many image sensors is loaded onto a wafer polisher. In the depicted example, because dye-edge structures 371 include a harder material than spacer layer 321, spacer layer 321 polishes faster than dye-edge structures 371, this results in the concave structure of spacer layer 321 which therefore provides an image sensor with increased edge resolution, in accordance with the teachings of the present invention. In one example, dye-edge structures 371 include silicon nitride and spacer layer 321 includes silicon oxide.

Figure 3F:
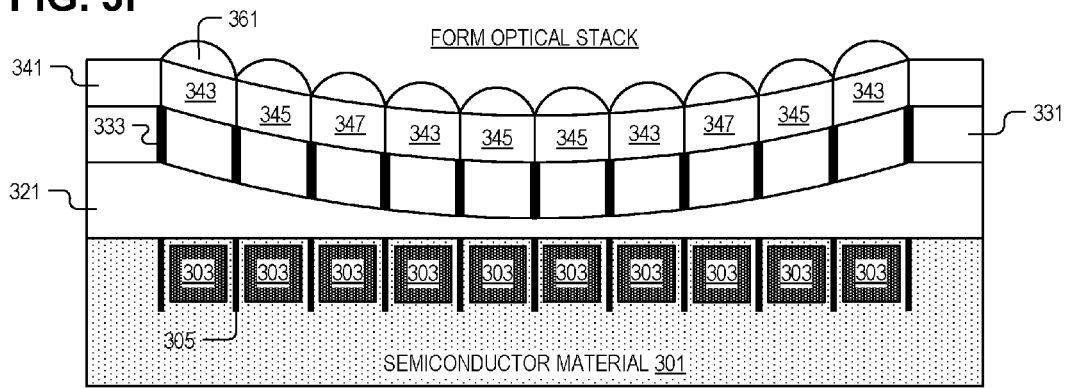

FIG. 3F shows an illustration of an example of removing dye-edge structures 371 from the surface of spacer layer 321 and forming the remainder of the curved image sensor optical architecture. In one example, dye-edge structures 371 are removed by an etching process. In the depicted example, optical grid layer 331 is disposed between spacer layer 321 and color filter layer 341. Optical grid layer 331, may include a metal optical grid 333 which directs light into plurality of photodiodes 303. Color filter layer 341 and microlens layer 361 are also formed. Color filter layer 341 is disposed between microlens layer 361 and spacer layer 321, and color filter layer 341, microlens layer 361, and optical grid layer 331 are optically aligned with plurality of photodiodes 303. It is worth noting that, in one example, color filter layer 341 includes red 343, green 345, and blue 347 color filters which may be arranged into a Bayer pattern, EXR pattern, X-trans pattern, or the like. It is worth noting that although the location of individual colors filters is specified in the depicted example, the placement, location, and order of color filters can take a number of configurations. For instance, in a different or the same example, color filter layer 341 may include infrared filters, ultraviolet filters, or other light filters that isolate invisible portions of the EM spectrum. In the same or a different example, microlens layer 361 may be fabricated from a photo-active polymer that is patterned on the surface of color filter layer 341. Once rectangular blocks of polymer are patterned on the surface of color filter layer 341, the blocks may be melted (or reflowed) to form the dome-like structure characteristic of microlenses. However, it should be noted that in one example, optical grid layer 331, color filter layer 341, and microlens layer 361 may not be present in the curved image sensor, or may be replaced by equivalent or substantially similar components (e.g., color filter layer may be replaced with a metal mesh to block specific wavelengths of light).

It is worth noting that for all semiconductor, oxide, and/or metal formation processes depicted in FIGS. 3A-3F, any suitable processing methods may be used. Thus, for any patterning, photolithography (utilizing negative or positive resists) may be employed to template the structure. Additionally, for material depositions, any suitable deposition technique may be used including: thermal evaporation, chemical vapor deposition, atomic layer deposition, molecular beam epitaxy, self-assembly, or the like.

Figure 4:
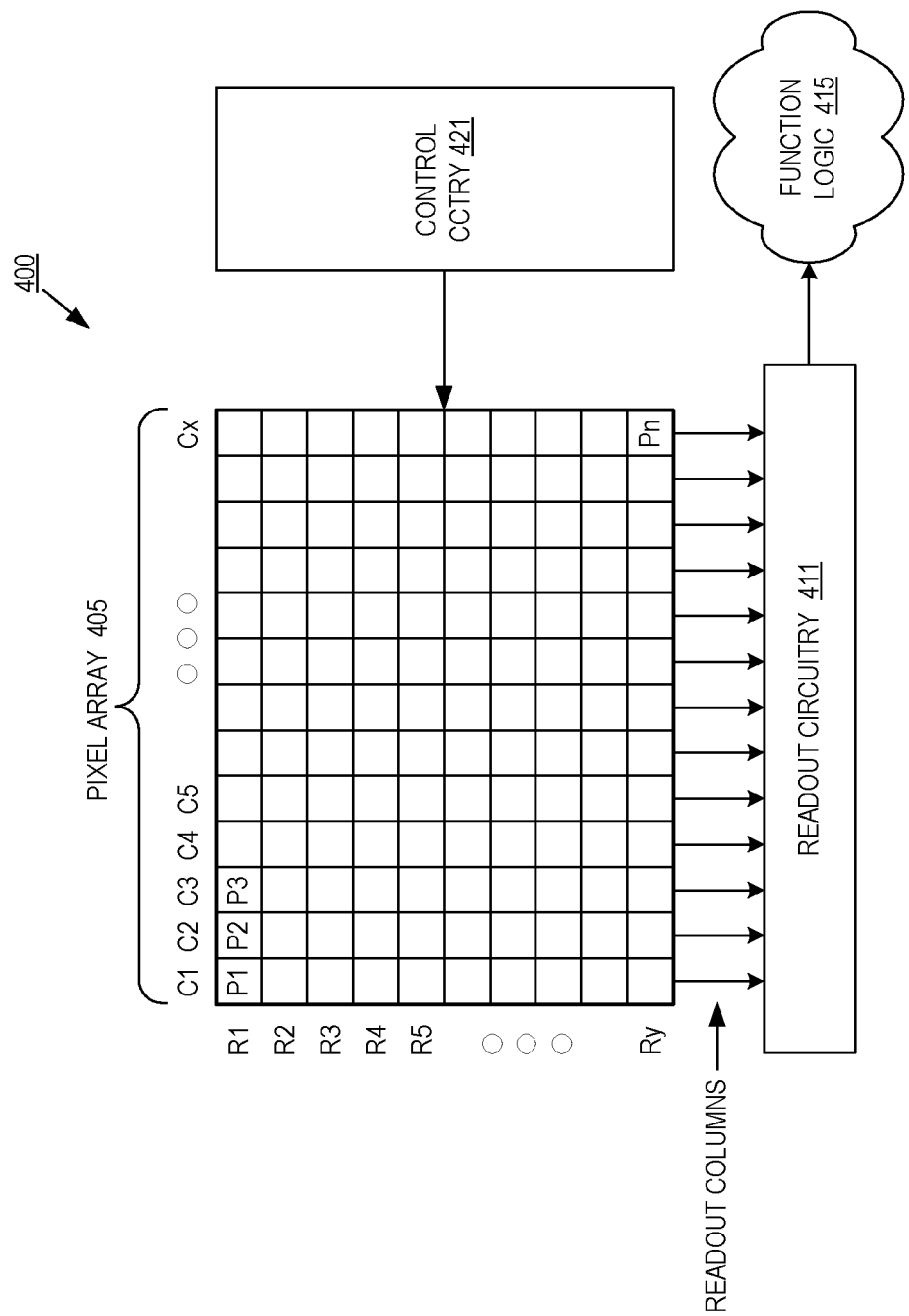
FIG. 4 is a block diagram illustrating one example of an imaging system including the curved image sensor of FIG. 2, in accordance with the teachings of the present invention.

FIG. 4 is a block diagram illustrating one example of an imaging system including the curved image sensor of FIG. 2 (e.g., curved image sensor 200). Imaging system 400 includes pixel array 405, control circuitry 421, readout circuitry 411, and function logic 415. In one example, pixel array 405 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, the rows and columns do not necessarily have to be linear and may take other shapes depending on use case.

In one example, after each image sensor photodiode/pixel in pixel array 405 has acquired its image data or image charge, the image data is readout by readout circuitry 411 and then transferred to function logic 415. Readout circuitry 411 may be coupled to readout image data from the plurality of photodiodes in pixel array 405. In various examples, readout circuitry 411 may include amplification circuitry, analog-to-digital (ADC) conversion circuitry, or otherwise. Function logic 415 may simply store the image data or even alter/manipulate the image data by applying post image effects (e.g., crop, rotate, remove red eye, adjust brightness, adjust contrast, or otherwise). In one example, readout circuitry 411 may readout a row of image data at a time along readout column lines (illustrated) or may readout the image data using a variety of other techniques (not illustrated), such as a serial readout or a full parallel readout of all pixels simultaneously.

In one example, control circuitry 421 is coupled to pixel array 405 to control operation of the plurality of photodiodes in pixel array 405. Control circuitry 421 may be configured to control operation of the pixel array 405. For example, control circuitry 421 may generate a shutter signal for controlling image acquisition. In one example, the shutter signal is a global shutter signal for simultaneously enabling all pixels within pixel array 405 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 400 may be included in a digital camera, cell phone, laptop computer, or the like. Additionally, imaging system 400 may be coupled to other pieces of hardware such as a processor, memory elements, output (USB port, wireless transmitter, HDMI port, etc.), lighting/flash, electrical input (keyboard, touch display, track pad, mouse, microphone, etc.), and/or display. Other pieces of hardware/software may deliver instructions to imaging system 400, extract image data from imaging system 400, or manipulate image data supplied by imaging system 400.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a plurality of photodiodes arranged in an array and disposed in a semiconductor material, wherein pinning wells are disposed between individual photodiodes in the plurality of photodiodes to electrically isolate the individual photodiodes;
   a microlens layer disposed proximate to the semiconductor material, wherein the microlens layer is optically aligned with the plurality of photodiodes; and
   a spacer layer disposed between the semiconductor material and the microlens layer, wherein the spacer layer has a concave cross-sectional profile across the array, and wherein the microlens layer is conformal with the concave cross-sectional profile of the spacer layer.

2. The image sensor of claim 1, further comprising a color filter layer and an optical grid layer, wherein the optical grid layer is disposed between the color filter layer and the spacer layer, and the color filter layer is disposed between the optical grid layer and the microlens layer, and wherein the optical grid layer is optically aligned with the plurality of photodiodes such that the optical grid layer directs light into the plurality of photodiodes.

3. The image sensor of claim 2, wherein the optical grid layer and the color filter layer are conformal with the concave cross-sectional profile of the spacer layer.

4. The image sensor of claim 1, wherein the pinning wells include doped semiconductor material.

5. The image sensor of claim 1, wherein a vertex of the concave cross-sectional profile of the spacer layer is located at a center of the array of the plurality of photodiodes.

6. The image sensor of claim 1, further comprising an optical lens disposed between a source of image light and the semiconductor material, wherein the optical lens is positioned to direct image light into the semiconductor material.

7. The image sensor of claim 6, wherein a radius of curvature of the concave cross-sectional profile of the spacer layer approximates a radius of curvature of the optical lens.

8. The image sensor of claim 1, further comprising control circuitry coupled to the plurality of photodiodes and readout circuitry coupled to the plurality of photodiodes, wherein the control circuitry controls operation of the plurality of photodiodes, and the readout circuitry reads out image data from the plurality of photodiodes.

9. The image sensor of claim 8, further comprising function logic, wherein the readout circuitry transfers the image data to the function logic to alter the image data.

10. A method of image sensor fabrication, comprising:
    providing a semiconductor material including a plurality of photodiodes arranged in an array;
    depositing a spacer layer disposed proximate to a surface of the semiconductor material;
    forming dye-edge structures on a surface of the spacer layer, wherein the dye-edge structures encircle the plurality of photodiodes, and wherein the dye-edge structures are elevated on the surface of the spacer layer; and
    polishing the spacer layer and dye-edge structures, wherein polishing results in a concave cross-sectional profile of the spacer layer across the array of the plurality of photodiodes.

11. The method of claim 10, further comprising removing the dye-edge structures from the surface of the spacer layer.

12. The method of claim 10, further comprising forming a color filter layer and a microlens layer, wherein the color filter layer is disposed between the microlens layer and the spacer layer, and wherein the color filter layer and the microlens layer are optically aligned with the plurality of photodiodes.

13. The method of claim 12, further comprising forming an optical grid layer disposed between the spacer layer and the color filter layer.

14. The method of claim 10, further comprising forming control circuitry and readout circuitry disposed in the semiconductor material.

15. The method of claim 10, wherein depositing a spacer layer includes etching an isolation trench in the semiconductor material, and depositing the spacer layer in the isolation trench and on the surface of the semiconductor material.

16. The method of claim 10, wherein forming dye-edge structures on the spacer layer includes:
    depositing a dye-edge layer on the spacer layer; and
    etching the dye-edge layer to form dye-edge structures.

17. The method of claim 16, wherein the dye-edge layer includes silicon nitride and the spacer layer includes silicon oxide.

18. The method of claim 10, wherein polishing the spacer layer and dye-edge structures includes removing a portion of the spacer layer to form the concave cross-sectional profile of the spacer layer.

19. The method of claim 10, wherein providing a semiconductor material includes forming a plurality of photodiodes in a backside of the semiconductor material.

20. The method of claim 19, further comprising forming pinning wells between individual photodiodes in the plurality of photodiodes.

* * * * *